United States Patent

Chao et al.

Patent Number: 6,156,600
Date of Patent: Dec. 5, 2000

[54] METHOD FOR FABRICATING CAPACITOR IN INTEGRATED CIRCUIT

[75] Inventors: Fang-Ching Chao; Wen-Yi Hsieh; Kuo-Tai Huang, all of Hsinchu, Taiwan

[73] Assignee: United Microelectronics Corp., Taiwan

[21] Appl. No.: 09/195,173

[22] Filed: Nov. 17, 1998

[30] Foreign Application Priority Data

Nov. 27, 1997 [TW] Taiwan .................................. 86117833

[51] Int. Cl.⁷ ............................................... H01L 21/8234
[52] U.S. Cl. .......................... 438/238; 438/238; 438/239; 438/253; 438/396; 438/398
[58] Field of Search ..................... 438/706, 778, 438/710, 149, 485, 166, 487, 49, 253, 592, 638, 239, 396, 398

[56] References Cited

U.S. PATENT DOCUMENTS

| | | | |
|---|---|---|---|
| 4,995,043 | 2/1991 | Kuwata et al. ............................. | 372/7 |
| 5,256,455 | 10/1993 | Numasawa ............................... | 427/576 |
| 5,274,485 | 12/1993 | Narita et al. ............................. | 359/58 |
| 5,508,223 | 4/1996 | Tseng ........................................ | 437/60 |
| 5,843,821 | 12/1998 | Tseng ........................................ | 438/253 |
| 5,913,129 | 6/1999 | Wu et al. .................................. | 438/398 |
| 5,937,307 | 8/1999 | Jenq et al. ................................ | 438/398 |
| 5,994,181 | 11/1999 | Hsieh et al. .............................. | 438/239 |
| 6,001,741 | 12/1999 | Alers ........................................ | 438/706 |

Primary Examiner—David Nelms
Assistant Examiner—Phuc T. Dang
Attorney, Agent, or Firm—Thomas, Kayden, Horstemeyer & Risley, L.L.P.

[57] ABSTRACT

A method for fabricating a capacitor in an integrated circuit, using tantalum oxide as the dielectric layer to obtain a higher capacitance. A barrier layer is formed between the polysilicon layer and the tantalum oxide layer to prevent the formation of a silicon oxide layer. Thus, that capacitance of the capacitor is not reduced by the additional thickness of the silicon oxide layer.

20 Claims, 3 Drawing Sheets

METHOD FOR FABRICATING CAPACITOR IN INTEGRATED CIRCUIT

CROSS-REFERENCE TO RELATED APPLICATION

This application claims the priority benefit of Taiwan application serial no. 86117833, filed Nov. 27, 1997, the full disclosure of which is incorporated herein by reference.

BACKGROUND OF THE INVENTION

1. Field of the Invention

The invention relates to a method for fabricating a capacitor in an integrated circuit (IC), and more particular to a method for fabricating a capacitor in a random dynamic access memory (DRAM) by using a tantalum oxide nitride ($TaO_xN_y$) layer as a barrier layer.

2. Description of the Related Art

In a DRAM, the typical method to access data is by charging or discharging optionally into each capacitor of the capacitor array on the semiconductor substrate.

Due to the higher and higher integration of IC, dimensions of devices or structures (such as transistors, capacitors) become smaller and smaller. Thus, the storage of charges (that is, the capacitance) of the capacitor in the design of a conventional planar capacitor decreases. The decrease of charge storage causes various problems, including mechanical deterioration and charge leakage by the larger susceptibility, and therefore, causes potential loss. The charge leakage caused by larger susceptibility may cause more frequent refresh period, and by which, memory can not handle data saving and reading properly. Moreover, the decrease of charge storage may need more complex data reading plan, or more sensitive charge induction amplifier.

Up to now, there are three ways to solve the problem of the decrease of capacitance of a capacitor due to the higher integration in a very large scaled integrated circuit. The first method is to reduce the thickness of the dielectric layer between two conductors of the capacitor. It is known that the capacitance is proportional to the inverse of distance between two conductors in a capacitor. Thus, the decrease of the thickness of dielectric layer can increase the capacitance effectively. However, according to the consideration of the uniformity and stability of the dielectric layer, this is a method difficult to control. The second method is to increase the surface area of the storage node of the capacitor. The capacitance is proportional to the surface area of storage node, that is, the conductor (electrode). Therefore, to increase the surface area of the storage node can increase the capacitance as well. The very common structure for increasing the surface area is the fin-shape or box-shape structure. These kinds of structures are complex for fabrication, and thus, cause the difficulty in mass production. The third method, which is the most direct method, is to adapt the material with high dielectric constant, such as, tantalum oxide ($Ta_2O_5$), as the dielectric layer.

FIG. 1a and FIG. 1b are sectional views of the capacitor with a tantalum oxide as the dielectric layer fabricated by the conventional method. Referring to FIG. 1a, a tantalum oxide layer 12 is formed on a polysilicon layer 10 which is used as the bottom electrode in the capacitor. Meanwhile, the structure of the tantalum oxide layer 12 is amorphous. Thus, due to the high concentration of defects, a very high leakage current is occurred. Therefore, an annealing step is performed for the re-arrangement of tantalum oxide layer 12. It is normally carried out in a nitrogen monoxide ($N_2O$) environment. Referring to FIG. 1b, due to the very thin thickness of the tantalum oxide 12, during the annealing process, oxygen will penetrate through the tantalum oxide layer 12, and react with the polysilicon layer 10 to form a thin silicon oxide ($SiO_2$) layer 14 between the tantalum oxide layer 12 and the polysilicon layer 10. It has been mentioned that the capacitance is proportional to the inverse of distance between two electrodes. Thus, although a material with very high dielectric constant is in use for the capacitor, the capacitor is degraded by another reason, that is, the increase thickness of the dielectric layer, silicon oxide layer 14.

Another integrated circuit structure, metal-insulator-metal (MIM) structure, is shown in FIG. 2a and FIG. 2b. Referring to FIG. 2a, a tantalum oxide layer 24 is formed on a polysilicon layer 20 covered by a metal layer 22. As mentioned above, the tantalum oxide is still an amorphous structure. An annealing process is necessary for the rearrangement. Similarly, while annealing, oxygen will penetrate through tantalum oxide layer 24 and approach the surface of the metal layer 22. The silicon atom in the polysilicon layer 20 will diffuse through the metal layer 22, and combine with the penetrated oxygen to form a silicon oxide layer 26. Again, the increment of thickness by the additional silicon oxide layer between the tantalum oxide layer 24 and the metal layer 22 cause a reduction of the capacitance.

SUMMARY OF THE INVENTION

It is therefore an object of the invention to provide a method for fabricating a capacitor in an integrated circuit. A material with a high dielectric constant is in use as the dielectric layer. The capacitance of the capacitor is increased without the formation of an additional silicon oxide layer.

To achieve these objects and advantages, and in accordance with the purpose of the invention, as embodied and broadly described herein, the invention is directed towards a method for fabricating a capacitor in an integrated circuit. First, a polysilicon layer is provided. A first tantalum oxide layer is formed on the polysilicon layer. By using a first rapid thermal anneal (RTA), the first tantalum oxide layer is transformed into a tantalum oxide nitride layer. A second tantalum oxide layer is formed on the first tantalum oxide nitride layer. The second tantalum oxide layer is rearranged by a second rapid thermal annealing process. By a third rapid thermal annealing process, a second tantalum oxide nitride layer is formed on the second tantalum oxide layer.

To achieve another object and advantage of the invention, a polysilicon layer covered by a metal layer is provided. A first tantalum oxide layer is formed on the metal layer. By using a first rapid thermal anneal (RTA), the first tantalum oxide layer is transformed into a tantalum oxide nitride layer. A second tantalum oxide layer is formed on the first tantalum oxide nitride layer. The second tantalum oxide layer is rearranged by a second rapid thermal annealing process. By a third rapid thermal annealing process, a second tantalum oxide nitride layer is formed on the second tantalum oxide layer.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate an embodiment of the invention and together with the description, serve to explain the principles of the invention. In the drawings.

DESCRIPTION OF THE PREFERRED EMBODIMENTS

On a polysilicon layer, which is used as a bottom electrode of a capacitor in a DRAM, a dielectric layer is form. In the conventional fabricating method, silicon oxide is used as the dielectric material. The dielectric constant of the silicon oxide is about 3.9. In the invention, tantalum oxide is used as the dielectric material, and the dielectric constant is about 20 to 25. Thus, by using tantalum oxide as the dielectric material in a capacitor, a larger capacitance is obtained. However, due to the amorphous structure and high concentration of defects of tantalum oxide, an annealing process is necessary for rearrangement of atoms in the material. While annealing, an additional silicon oxide layer is formed between the tantalum oxide layer and the bottom electrode, that is, the polysilicon layer. In the invention, a barrier layer, that is, a tantalum oxide nitride layer is formed between the bottom electrode and the tantalum oxide layer to prevent the penetration of oxygen atom through the tantalum oxide layer and to approach the surface of the polyslicon layer (bottom electrode). Therefore, the formation of a silicon oxide layer is avoided. Furthermore, apart from the bottom electrode and the dielectric layer, to construct a capacitor, there is yet a top electrode. Therefore, after the formation of dielectric layer, a conductor layer, such as a polysilicon layer, is formed on the dielectric layer. Again, an annealing process is needed. While annealing, to avoid the formation of a silicon oxide layer on the tantalum oxide layer, another thin tantalum oxide nitride layer is formed between the tantalum oxide layer and the polysilicon layer (top electrode).

Moreover, in an MIM structure, similarly, to avoid the formation of an additional silicon oxide layer on the tantalum oxide layer, a thin tantalum oxide nitride layer is formed to prevent the diffusion of the oxygen and silicon, and thus, to prevent the formation of silicon oxide layer.

Figure 1A:
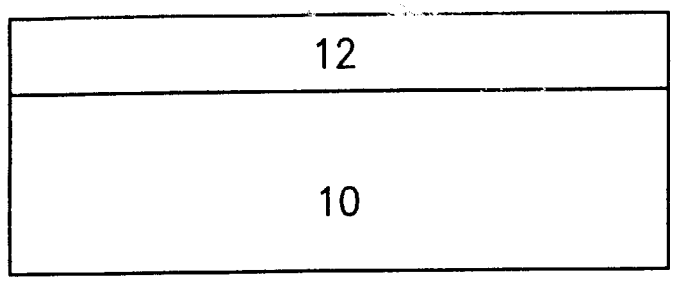
FIG. 1a and FIG. 1b show the conventional method for fabricating a capacitor in a DRAM.
Figure 1B:
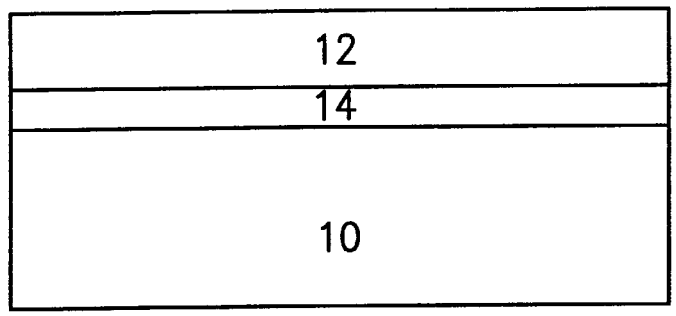
Figure 2A:
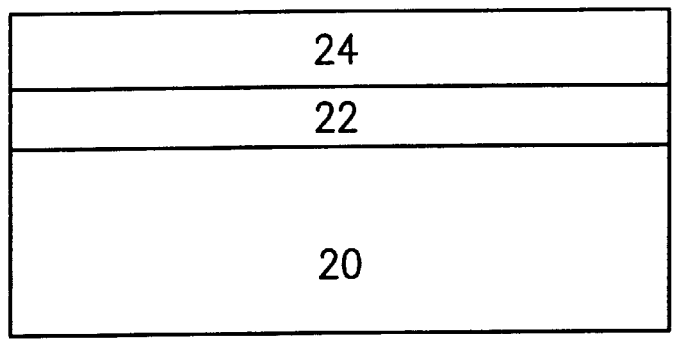
FIG. 2a and FIG. 2b show the conventional method for fabricating a capacitor in an MIM structure.
Figure 2B:
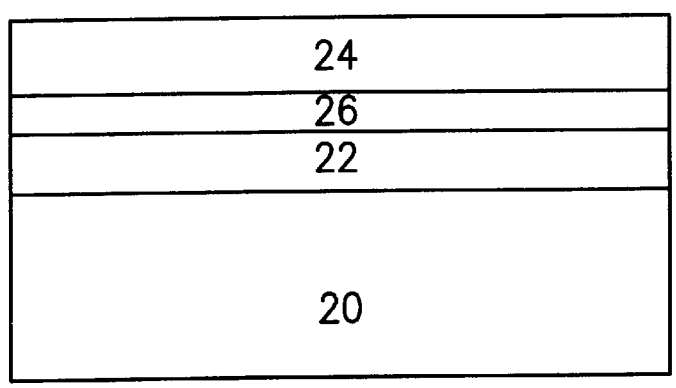
Figure 3A:
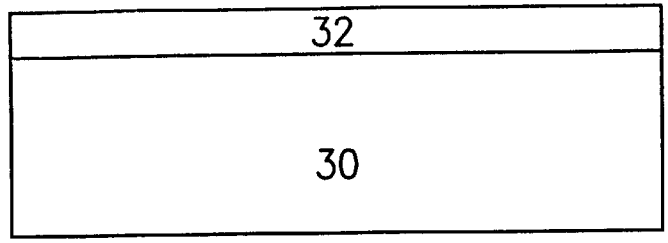
FIG. 3a and FIG. 3d show the method for fabricating a capacitor in a first preferred embodiment according to the invention.

Referring to FIG. 3a, on the polysilicon layer 30, that is, the bottom electrode, a first tantalum oxide layer 32 is formed, for example, by low pressure vapor deposition (LPCVD) and using tetra-acetyl-ethyl-tantalum-oxide (TATEO) as the precursor at the temperature between about 300° C. to 550° C., for example, at 400° C. The thickness of the tantalum oxide layer 32 is about 1 nm to 2 nm.

Figure 3B:
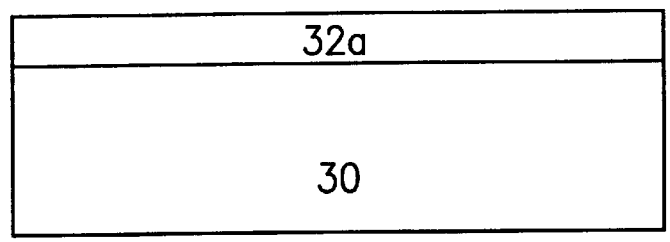

Referring to FIG. 3b, the whole deposition layers are brought into an environment of ammonia ($NH_3$) at about 800° C. for about 40 sec to 2 min, for example, 60 sec, for rapid thermal anneal. The tantalum oxide layer 32 is transformed into a tantalum oxide nitride layer 32a. The tantalum oxide nitride layer 32a can be formed in the same chamber as the tantalum oxide layer 32. The formation of the tantalum oxide nitride layer 32a is to prevent the silicon atom in the polysilicon layer to diffuse through the tantalum oxide layer and combine with the oxygen to form a silicon oxide layer in the subsequent annealing process. If the silicon oxide is formed, the thickness of the dielectric layer is increased, and the capacitance is reduced. The capacitor is degraded.

Figure 3C:
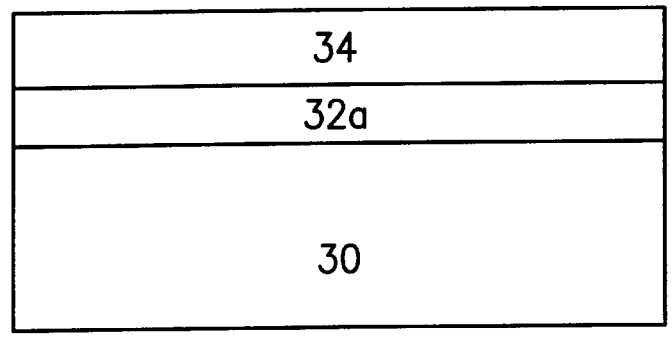

Referring to FIG. 3c, on the tantalum oxide nitride 32a, by LPCVD and using TAETO as the precursor, a tantalum oxide layer 34 with a thickness of about 70 Å to 150 Å, preferably 150 Å, is formed at about 300° C. to 550° C., for example, 400° C. Meanwhile, the tantalum oxide 34 is still in an amorphous structure, due to its high concentration of defects, a large leakage will affect the subsequent process. Thus, a rapid thermal anneal is performed to rearrange the atoms in the tantalum oxide layer 34. The rapid thermal anneal process is performed under an environment of nitrogen monoxide. The annealing temperature is about 800° C., and the annealing interval is about 40 sec to 2 min.

Figure 3D:
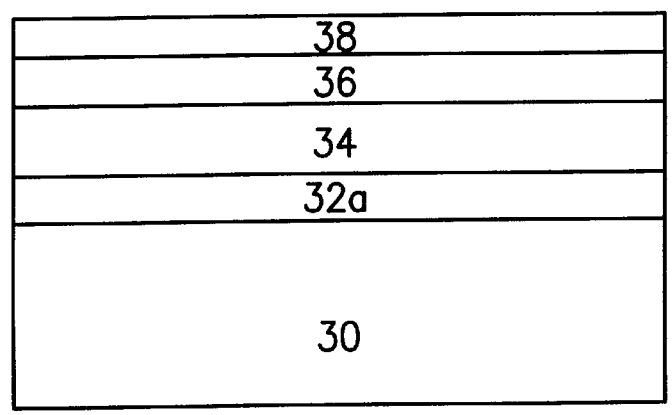
Figure 4A:
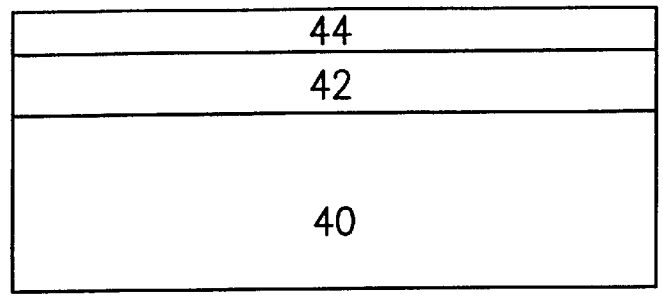
FIG. 4a and FIG. 4d show the method for fabricating a capacitor in a second preferred embodiment according to the invention.
Figure 4B:
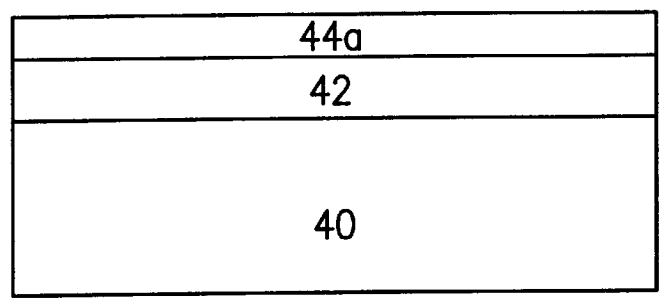
Figure 4C:
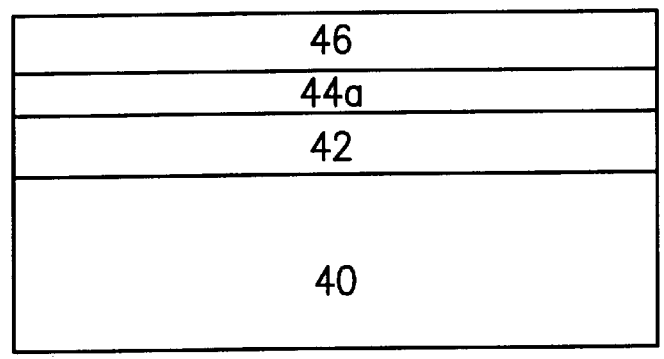
Figure 4D:
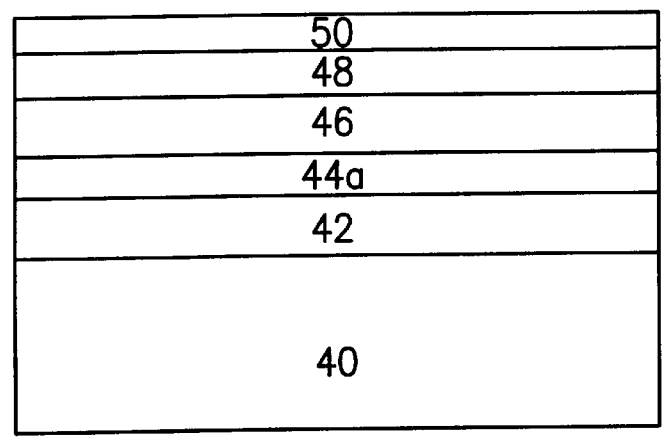

Referring to FIG. 3d, another annealing process is performed. The whole deposition layers are brought into an environment of ammonia at about 800° C. for about 40 sec to 2 min, for example, 60 sec. A tantalum oxide nitride ($TaO_xN_y$) 36 is formed on the tantalum oxide layer 34. A top electrode 38 is then formed on the tantalum oxide nitride layer. The remaining tantalum oxide layer 34a is shown as figure.

The invention can also be applied in an MIM structure, as shown on FIG. 4a to FIG. 4d. On a polysilicon layer 40 covered by a metal layer 42, by using LPCVD and TAETO as the precursor, a tantalum oxide 44 with a thickness of about 1 nm to 2 nm is formed at about 300° C. to 550° C., for example, 400° C. The whole deposition layers are then brought into an environment of ammonia at about 800° C. for a rapid thermal annealing process. The annealing interval is about 40 sec to 2 min, for example, 60 sec. While annealing, the tantalum oxide layer 44 is transformed into a tantalum oxide nitride layer ($TaO_xN_y$) 44a. The tantalum oxide nitride layer ($TaO_xN_y$) 44a can be formed in the same chamber for the formation of the tantalum oxide layer 44.

Again, using TAETO as the precursor, by LPCVD, a tantalum oxide layer 46 with a thickness of about 70 Å to 150 Å, for example 100 Å, is formed. A rapid thermal annealing process is then performed under the environment of dinitrogen oxide to rearrange the atoms of the tantalum oxide layer 46. The annealing temperature is about 800° C., and the annealing interval is about 40 sec to 2 min.

A further rapid thermal annealing is performed. The annealing is performed under an ammonia environment at about 800° C. for about 40 sec to 2 min, for example, 60 sec. A tantalum oxide nitride layer 48 is thus formed. A top electrode 50 is then formed on the tantalum oxide nitride layer 48. The remaining tantalum oxide layer 46a is shown as the figure. A top electrode 50 is then formed over the substrate.

It is known that the capacitance of a capacitor is inversely proportional to the thickness of the dielectric layer. Using a tantalum oxide nitride layer between the conductor layers (metal layers or polysilicon layer) and the dielectric layer (tantalum oxide layer) as a barrier layer to prevent the formation of a silicon oxide layer, the increase of thickness can be avoided. Thus, the degradation of capacitor can be prevented.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a capacitor in an integrated circuit, comprising:

forming a bottom electrode on a substrate;

forming a first tantalum oxide layer on the bottom electrode;

forming a first tantalum oxide nitride layer on the first tantalum oxide layer;

forming a second tantalum oxide layer on the first tantalum oxide nitride layer;

forming a second tantalum oxide nitride layer on the second tantalum oxide layer; and forming a top electrode.

2. The method according to claim 1, wherein the bottom electrode is a polysilicon layer.

3. The method according to claim 1, wherein the first tantalum oxide layer is formed by low pressure chemical vapor deposition and using tetra-acetyl-ethyl-tantalum-oxide as precursor at a deposition temperature between about 300° C. to 550° C.

4. The method according to claim 3, wherein the deposition temperature is about 400° C.

5. The method according to claim 1, wherein the first tantalum oxide layer is formed by low pressure chemical vapor deposition and using tetra-acetylethyl-tantalum-oxide as precursor at a deposition temperature about 400° C.

6. The method according to claim 1, wherein the first tantalum oxide layer has a thickness of about 1 nm to 2 nm.

7. The method according to claim 1, wherein after the first tantalum oxide layer is formed, a first rapid thermal anneal is performed to form the first tantalum oxide nitride layer, wherein, the first rapid thermal anneal is performed under:

an environment of ammonia;

an annealing temperature at about 800° C.; and an annealing interval of about 40 sec to 2 min.

8. The method according to claim 7, wherein the first tantalum oxide nitride layer is formed by reacting the first tantalum oxide layer with the ammonia.

9. The method according to claim 1, wherein the second tantalum oxide layer is formed by low pressure chemical vapor deposition and using tetra-acetyl-ethyl-tantalum-oxide as precursor at a deposition temperature between about 300° C. to 550° C.

10. The method according to claim 9, wherein the deposition temperature is about 400° C.

11. The method according to claim 1, wherein the second tantalum oxide layer is formed by low pressure chemical vapor deposition and using tetra-acetyl-ethyl-tantalum-oxide as precursor at a deposition temperature about 400° C.

12. The method according to claim 1, wherein the second tantalum oxide layer has a thickness of about 70 Å to 150 Å.

13. The method according to claim 1, wherein after the second tantalum oxide layer is formed, a second rapid thermal anneal is performed under:

an environment of dinitrogen oxide;

an annealing temperature at about 800° C.; and an annealing interval of about 40 sec to 2 min.

14. The method according to claim 1, the second tantalum oxide nitride layer is formed by performing a third rapid thermal anneal under:

an environment of ammonia;

an annealing temperature at about 800° C.; and an annealing interval of about 40 sec to 2 min.

15. The method according to claim 14, wherein the second tantalum oxide nitride layer is formed by reacting the second tantalum oxide layer with the ammonia.

16. The method according to claim 1, wherein the top electrode is a polysilicon layer.

17. The method according to claim 1, wherein the top electrode is a metal layer.

18. The method according to claim 1, wherein a metal layer is further included between the bottom electrode and the first tantalum oxide layer.

19. A method for fabricating a capacitor in an integrated circuit, comprising:

forming a bottom electrode on a substrate;

forming a first tantalum oxide layer on the bottom electrode;

converting the first tantalum oxide into a tantalum oxide nitride layer;

forming a second tantalum oxide layer on the first tantalum oxide nitride layer;

forming a second tantalum oxide nitride layer on the second tantalum oxide layer; and forming a top electrode.

20. A method for fabricating a capacitor in an integrated circuit, comprising:

forming a bottom electrode on a substrate;

forming a first tantalum oxide nitride layer on the bottom electrode;

forming a first tantalum oxide layer on the first tantalum oxide nitride layer;

forming a second tantalum oxide nitride layer on the first tantalum oxide layer; and forming a top electrode.

* * * * *